United States Patent
Li

(10) Patent No.: US 10,255,869 B2
(45) Date of Patent: Apr. 9, 2019

(54) GOA CIRCUIT

(71) Applicant: Wuhan China Star Optoelectronics Technology Co., Ltd., Wuhan (CN)

(72) Inventor: Yafeng Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 148 days.

(21) Appl. No.: 15/506,240

(22) PCT Filed: Dec. 30, 2016

(86) PCT No.: PCT/CN2016/113317
§ 371 (c)(1),
(2) Date: Feb. 24, 2017

(87) PCT Pub. No.: WO2018/119963
PCT Pub. Date: Jul. 5, 2018

(65) Prior Publication Data
US 2018/0218695 A1    Aug. 2, 2018

(30) Foreign Application Priority Data
Dec. 27, 2016 (CN) .............................. 2016 1 122964

(51) Int. Cl.
  *G09G 3/36*    (2006.01)
  *G11C 19/18*   (2006.01)
  *G11C 19/28*   (2006.01)

(52) U.S. Cl.
  CPC ......... *G09G 3/3648* (2013.01); *G09G 3/3677* (2013.01); *G11C 19/18* (2013.01); *G11C 19/28* (2013.01); *G09G 2300/0426* (2013.01); *G09G 2310/0286* (2013.01); *G09G 2310/067* (2013.01); *G09G 2310/08* (2013.01)

(58) Field of Classification Search
  CPC .. G09G 3/3266; G09G 3/3648; G09G 3/3677; G09G 3/3233; G09G 2300/0426; G09G 2310/067; G09G 2310/08; G09G 2310/0286; G11C 19/18; G11C 19/28
  See application file for complete search history.

(56) References Cited

U.S. PATENT DOCUMENTS

| 2016/0086562 A1* | 3/2016 | Tan ....................... G09G 3/3677 345/215 |
| 2017/0032752 A1* | 2/2017 | Huang ................. G09G 3/3648 |
| 2017/0116924 A1* | 4/2017 | Zhang ................. G09G 3/3233 |

\* cited by examiner

*Primary Examiner* — Lunyi Lao
*Assistant Examiner* — Johny Lau
(74) *Attorney, Agent, or Firm* — Leong C. Lei

(57) ABSTRACT

The present invention relates to a GOA circuit. The GOA circuit comprises: a first thin film transistor (T1) to a fourteenth thin film transistor (T14), a first capacitor (C1) and a second capacitor (C2). The present invention adds a control unit consisted of thin film transistors (T9-T14) on the basis of the GOA circuit structure according to prior art, and a set of control signals (Select1, Select2) of which phases are opposite is introduced. The main function is to divide the gate output of the GOA circuit into two. In some special display mode, the frequency corresponded with Data signal will be halved, and the corresponding drive power consumption will be decreased. The present invention provides a GOA circuit, which can effectively reduce the layout space occupied by the GOA circuit for having a certain help to the development of the narrow frame technology.

15 Claims, 9 Drawing Sheets

GOA CIRCUIT

FIELD OF THE INVENTION

The present invention relates to a display device field, and more particularly to a GOA circuit.

BACKGROUND OF THE INVENTION

Gate Driver On Array (GOA) technology is a kind of technology that the thin film transistor liquid crystal display array (Array) process is utilized to manufacture the Gate row scan drive signal circuit on the array substrate to realize the drive manner to scan the gates row by row.

As designing the GOA circuit according to prior art, the output row by row of the gate is realized by multiple cascaded levels manner. Please refer to FIG. 1, which is a diagram of a GOA circuit according to prior art. The GOA unit correspondingly outputs the horizontal scan signal of nth row in the upper part in FIG. 1, and the GOA unit correspondingly outputs the horizontal scan signal of n+1th row in the lower part in FIG. 1. The nth level GOA unit is illustrated to describe the structure of the GOA circuit according to prior art. The GOA circuit of prior art comprises a plurality of GOA circuit units which are cascade coupled, wherein the nth level GOA circuit unit outputting a nth row horizontal scan signal comprises: a first thin film transistor T1, of which a gate is coupled to a signal output point Gn−2 of the n−2th level GOA circuit unit, and a source and a drain are respectively coupled to a node Hn and inputted with a forward scan control signal U2D; a second thin film transistor T2, of which a gate is coupled to the node Qn, and a source and a drain are respectively coupled to a signal output point Gn of the nth level GOA circuit unit and inputted with a clock signal CKV1; a third thin film transistor T3, of which a gate is coupled to a signal output point Gn+2 of the n+2th level GOA circuit unit, and a source and a drain are respectively coupled to the node Hn and inputted with the forward scan control signal D2U; a fourth thin film transistor T4, of which a gate is coupled to a node Pn, and a source and a drain are respectively coupled to the signal output point Gn and the constant low voltage level VGL; a fifth thin film transistor T5, of which a gate is coupled to a constant high voltage level VGH, and a source and a drain are respectively coupled to the node Hn and a node Qn; a sixth thin film transistor T6, of which a gate is coupled to the node Pn, and a source and a drain are respectively coupled to the node Hn and the constant low voltage level VGL; a seventh thin film transistor T7, of which a gate is coupled to the node Hn, and a source and a drain are respectively coupled to the node Pn and a constant low voltage level VGL; an eighth thin film transistor T8, of which a gate is inputted with a clock signal CKV3, and a source and a drain are respectively coupled to the node Pn and the constant high voltage level VGH; a first capacitor C1, of which two ends are respectively coupled to the node Qn and the signal output point Gn; a second capacitor C2, of which two ends are respectively coupled to the node Pn and the constant low voltage level VGL. The point Q (i.e. Qn) is the point employed to control the output of the gate drive signal; the node point P (i.e. Pn) is the point employed to maintain the stability of the low voltage levels of the point Qn and the point Gn. The dotted lines portion in FIG. 1 is a forward-backward scan unit of the GOA circuit. The circuit structure of the n+1th level GOA circuit unit is similar with that of the nth level. The description is omitted here.

Please refer to FIG. 2, which is a forward scan sequence diagram of the GOA circuit in FIG. 1. With combination of FIG. 1, the specific work process (forward scan) of the circuit is introduced below:

the output of the level Gn is illustrated; as forward scan, U2D is high voltage level, and D2U is low voltage level;

stage 1, pre-charge stage, Gn−2 and U2D are high voltage levels at the same time, and T1 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Gn outputs high voltage level: in stage 1, the point Qn is pre-charged, and C1 has a certain maintaining function to the electrical charges, and T2 is in an on state, and high voltage level of CKV1 is outputted to the end Gn;

stage 3, Gn outputs low voltage level: C1 has the maintaining function to the high voltage level to the point Qn, and the low voltage level of CKV1 pulls down the point Gn;

stage 4, the point Qn is pulled down to VGL: as Gn+2 is high voltage level, D2U is low voltage level, and T3 is in an on state, and thus, the point Qn is pulled down to be VGL;

stage 5, the point Qn and the point of Gn maintain low voltage level: after the point Qn becomes low voltage level, T7 is in an off state, and as CKV3 jumps to high voltage level, T8 is on, and the point Pn is charge, and then both T4 and T6 are in an on state, which can ensure the low voltage level stabilities of the point Qn and the point Gn, and meanwhile, C2 has a certain maintaining function to high voltage level of the point Pn.

Certainly, the output principle of the Gn+1 level is similar with the output of the Gn level but only the control sequence circulates according to a certain rule.

Please refer to FIG. 3, which is a backward scan sequence diagram of the GOA circuit in FIG. 1. With combination of FIG. 1, the specific work process (backward scan) of the circuit is introduced below:

the output of the level Gn is illustrated; as forward scan, U2D is high voltage level, and D2U is low voltage level;

stage 1, pre-charge stage, Gn+2 and D2U are high voltage levels at the same time, and T3 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Gn outputs high voltage level: in stage 1, the point Qn is pre-charged, and C1 has a certain maintaining function to the electrical charges, and T2 is in an on state, and high voltage level of CKV1 is outputted to the end Gn;

stage 3, Gn outputs low voltage level: C1 has the maintaining function to the high voltage level to the point Qn, and the low voltage level of CKV1 pulls down the point Gn;

stage 4, the point Qn is pulled down to VGL: as Gn−2 is high voltage level, U2D is low voltage level, and T1 is in an on state, and thus, the point Qn is pulled down to be VGL;

stage 5, the point Qn and the point of Gn maintain low voltage level: after the point Qn becomes low voltage level, T7 is in an off state, and as CKV3 jumps to high voltage level, T8 is on, and the point Pn is charge, and then both T4 and T6 are in an on state, which can ensure the low voltage level stabilities of the point Qn and the point Gn, and meanwhile, C2 has a certain maintaining function to high voltage level of the point Pn.

Certainly, the output principle of the Gn+1 level is similar with the output of the Gn level but only the control sequence circulates according to a certain rule. In one aspect, according to the development of LCD at present, the narrow frame becomes more and more popular, and particularly the decrease of the left, right borders. As designing the GOA circuit according to prior art, the output row by row of the gate is realized by multiple cascaded levels manner. The GOA circuit is shown in FIG. 1, and the corresponding outputs of the Gn+1, Gn levels, the detail sequence are shown in FIG. 2 and FIG. 3. The full high resolution display (FHD) Interlace drive manner is illustrated. the single side has the gate outputs of 960 levels, which correspond to the layout of 480 levels shown in FIG. 1. As the left, right borders constantly decreases, the GOA circuit design of prior art might not satisfy the design requirement.

In another aspect, for satisfying the requirement of image high quality sometimes, most of the Data drives utilize the Dot Inversion manner. Namely, the data signal has to jump high and low constantly, the power consumption for the Dot Inversion is relatively higher, and the calculation formula of the power consumption is below:

$$P=\tfrac{1}{2}*C*f*V^2$$

C is the capacitor, and f is the frequency, and V is the voltage.

SUMMARY OF THE INVENTION

An objective of the present invention is to provide a new GOA circuit structure, to reduce the layout space occupied by the GOA circuit.

For realizing the aforesaid objective, the present invention provides a GOA circuit, comprising a plurality of GOA circuit units which are cascade coupled, wherein n is set to be a natural number, and the nth level GOA circuit unit in charge of outputting horizontal scan signals of a 2n−1th row and a 2nth row comprises:

a first thin film transistor, of which a gate is coupled to a first node of an n−2th level GOA circuit unit, and a source and a drain are respectively coupled to a second node and inputted with a forward scan control signal;

a second thin film transistor, of which a gate is coupled to a third node, and a source and a drain are respectively coupled to a first node of an nth level GOA circuit unit and inputted with a first clock signal;

a third thin film transistor, of which a gate is coupled to a first node of an n+2th level GOA circuit unit, and a source and a drain are respectively coupled to the second node and inputted with a backward scan control signal;

a fourth thin film transistor, of which a gate is coupled to a fourth node, and a source and a drain are respectively coupled to the first node of the nth level GOA circuit unit and a constant low voltage level;

a fifth thin film transistor, of which a gate is coupled to a constant high voltage level, and a source and a drain are respectively coupled to the second node and the third node;

a sixth thin film transistor, of which a gate is coupled to the fourth node, and a source and a drain are respectively coupled to the second node and the constant low voltage level;

a seventh thin film transistor, of which a gate is coupled to the second node, and a source and a drain are respectively coupled to the fourth node and the constant low voltage level;

an eighth thin film transistor, of which a gate is inputted with a second clock signal, and a source and a drain are respectively coupled to the fourth node and the constant high voltage level;

a ninth thin film transistor, of which a gate is inputted with a first control signal, and a first source/a first drain is coupled to the first node of the nth level GOA circuit unit, and a second source/a second drain is coupled to first sources/first drains of an eleventh thin film transistor and a twelfth thin film transistor;

a tenth thin film transistor, of which a gate is inputted with a second control signal, and a first source/a first drain is coupled to the first node of the nth level GOA circuit unit, and a second source/a second drain is coupled to first sources/first drains of a thirteenth thin film transistor and a fourteenth thin film transistor;

the eleventh thin film transistor, of which a gate is inputted with the first control signal, and a second source/a second drain is coupled to a first signal output point of the nth level GOA circuit unit;

the twelfth thin film transistor, of which a gate is inputted with the second control signal, and a second source/a second drain is coupled to the constant low voltage level;

the thirteenth thin film transistor, of which a gate is inputted with the first control signal, and a second source/a second drain is coupled to the constant low voltage level;

the fourth thin film transistor, of which a gate is inputted with the second control signal, and a second source/a second drain is coupled to a second signal output point of the nth level GOA circuit unit;

a first capacitor, of which two ends are respectively coupled to the third node and the first node of the nth level GOA circuit unit;

a second capacitor, of which two ends are respectively coupled to the fourth node and the constant low voltage level, wherein the nth level GOA circuit unit further comprises:

a fifteenth thin film transistor, of which a gate is inputted with the second control signal, and a second source and a second drain are respectively coupled to the first signal output point of the nth level GOA circuit unit and the constant low voltage level;

a sixteenth thin film transistor, of which a gate is inputted with the first control signal, and a source and a drain are respectively coupled to the second signal output point of the nth level GOA circuit unit and the constant low voltage level;

a seventeenth thin film transistor, of which a gate is inputted with a third control signal, and a source and a drain are respectively coupled to the first signal output point of the nth level GOA circuit unit and a first source/a first drain of an eighteenth thin film transistor;

the eighteenth thin film transistor, of which a gate is inputted with the third control signal, and a second source/a second drain is coupled to the first node of the nth level GOA circuit unit;

a nineteenth thin film transistor, of which a gate is inputted with the third control signal, and a first source/a first drain is coupled to the first node of the nth level GOA circuit unit, and a second source/a second drain is coupled to a first source/a first drain of a twentieth thin film transistor;

the twentieth thin film transistor, of which a gate is inputted with the third control signal, and a second source/a second drain is coupled to the second signal output point of the nth level GOA circuit unit.

The first clock signal and the second clock signal are square waves that duty ratios are 0.25, and phases of the first clock signal and the second clock signal are different with a half cycle.

In a normal display state, the first control signal and the second control signal are alternately to be a high voltage level, and the third control signal is a low voltage level all the time.

In a low power display state, both the first control signal and the second control signal are low voltage levels, and the third control signal is a high voltage level all the time.

For the first level GOA circuit unit, as the forward scan starts, the first node of the n−2th level GOA circuit unit is inputted with a high voltage level signal to be an activation signal.

For the last level GOA circuit unit, as the backward scan starts, the first node of the n+2th level GOA circuit unit is inputted with a high voltage level signal to be an activation signal.

The low power display state is a standby mode.

The low power display state is a power saving mode.

The present invention further provides a GOA circuit, comprising a plurality of GOA circuit units which are cascade coupled, wherein n is set to be a natural number, and the nth level GOA circuit unit in charge of outputting horizontal scan signals of a 2n−1th row and a 2nth row comprises:

a first thin film transistor, of which a gate is coupled to a first node of an n−2th level GOA circuit unit, and a source and a drain are respectively coupled to a second node and inputted with a forward scan control signal;

a second thin film transistor, of which a gate is coupled to a third node, and a source and a drain are respectively coupled to a first node of an nth level GOA circuit unit and inputted with a first clock signal;

a third thin film transistor, of which a gate is coupled to a first node of an n+2th level GOA circuit unit, and a source and a drain are respectively coupled to the second node and inputted with a backward scan control signal;

a fourth thin film transistor, of which a gate is coupled to a fourth node, and a source and a drain are respectively coupled to the first node of the nth level GOA circuit unit and a constant low voltage level;

a fifth thin film transistor, of which a gate is coupled to a constant high voltage level, and a source and a drain are respectively coupled to the second node and the third node;

a sixth thin film transistor, of which a gate is coupled to the fourth node, and a source and a drain are respectively coupled to the second node and the constant low voltage level;

a seventh thin film transistor, of which a gate is coupled to the second node, and a source and a drain are respectively coupled to the fourth node and the constant low voltage level;

an eighth thin film transistor, of which a gate is inputted with a second clock signal, and a source and a drain are respectively coupled to the fourth node and the constant high voltage level;

a ninth thin film transistor, of which a gate is inputted with a first control signal, and a first source/a first drain is coupled to the first node of the nth level GOA circuit unit, and a second source/a second drain is coupled to first sources/first drains of an eleventh thin film transistor and a twelfth thin film transistor;

a tenth thin film transistor, of which a gate is inputted with a second control signal, and a first source/a first drain is coupled to the first node of the nth level GOA circuit unit, and a second source/a second drain is coupled to first sources/first drains of a thirteenth thin film transistor and a fourteenth thin film transistor;

the eleventh thin film transistor, of which a gate is inputted with the first control signal, and a second source/a second drain is coupled to a first signal output point of the nth level GOA circuit unit;

the twelfth thin film transistor, of which a gate is inputted with the second control signal, and a second source/a second drain is coupled to the constant low voltage level;

the thirteenth thin film transistor, of which a gate is inputted with the first control signal, and a second source/a second drain is coupled to the constant low voltage level;

the fourth thin film transistor, of which a gate is inputted with the second control signal, and a second source/a second drain is coupled to a second signal output point of the nth level GOA circuit unit;

a first capacitor, of which two ends are respectively coupled to the third node and the first node of the nth level GOA circuit unit;

a second capacitor, of which two ends are respectively coupled to the fourth node and the constant low voltage level;

wherein the nth level GOA circuit unit further comprises:

a fifteenth thin film transistor, of which a gate is inputted with the second control signal, and a second source and a second drain are respectively coupled to the first signal output point of the nth level GOA circuit unit and the constant low voltage level;

a sixteenth thin film transistor, of which a gate is inputted with the first control signal, and a source and a drain are respectively coupled to the second signal output point of the nth level GOA circuit unit and the constant low voltage level;

a seventeenth thin film transistor, of which a gate is inputted with a third control signal, and a source and a drain are respectively coupled to the first signal output point of the nth level GOA circuit unit and a first source/a first drain of an eighteenth thin film transistor;

the eighteenth thin film transistor, of which a gate is inputted with the third control signal, and a second source/a second drain is coupled to the first node of the nth level GOA circuit unit;

a nineteenth thin film transistor, of which a gate is inputted with the third control signal, and a first source/a first drain is coupled to the first node of the nth level GOA circuit unit, and a second source/a second drain is coupled to a first source/a first drain of a twentieth thin film transistor;

the twentieth thin film transistor, of which a gate is inputted with the third control signal, and a second source/a second drain is coupled to the second signal output point of the nth level GOA circuit unit;

wherein for the first level GOA circuit unit, as the forward scan starts, the first node of the n−2th level GOA circuit unit is inputted with a high voltage level signal to be an activation signal;

For the last level GOA circuit unit, as the backward scan starts, the first node of the n+2th level GOA circuit unit is inputted with a high voltage level signal to be an activation signal.

In conclusion, the present invention provides a GOA circuit, which can effectively reduce the layout space occupied by the GOA circuit for having a certain help to the development of the narrow frame technology; it can reduce the drive power consumption of the panel in some special display mode.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 8:
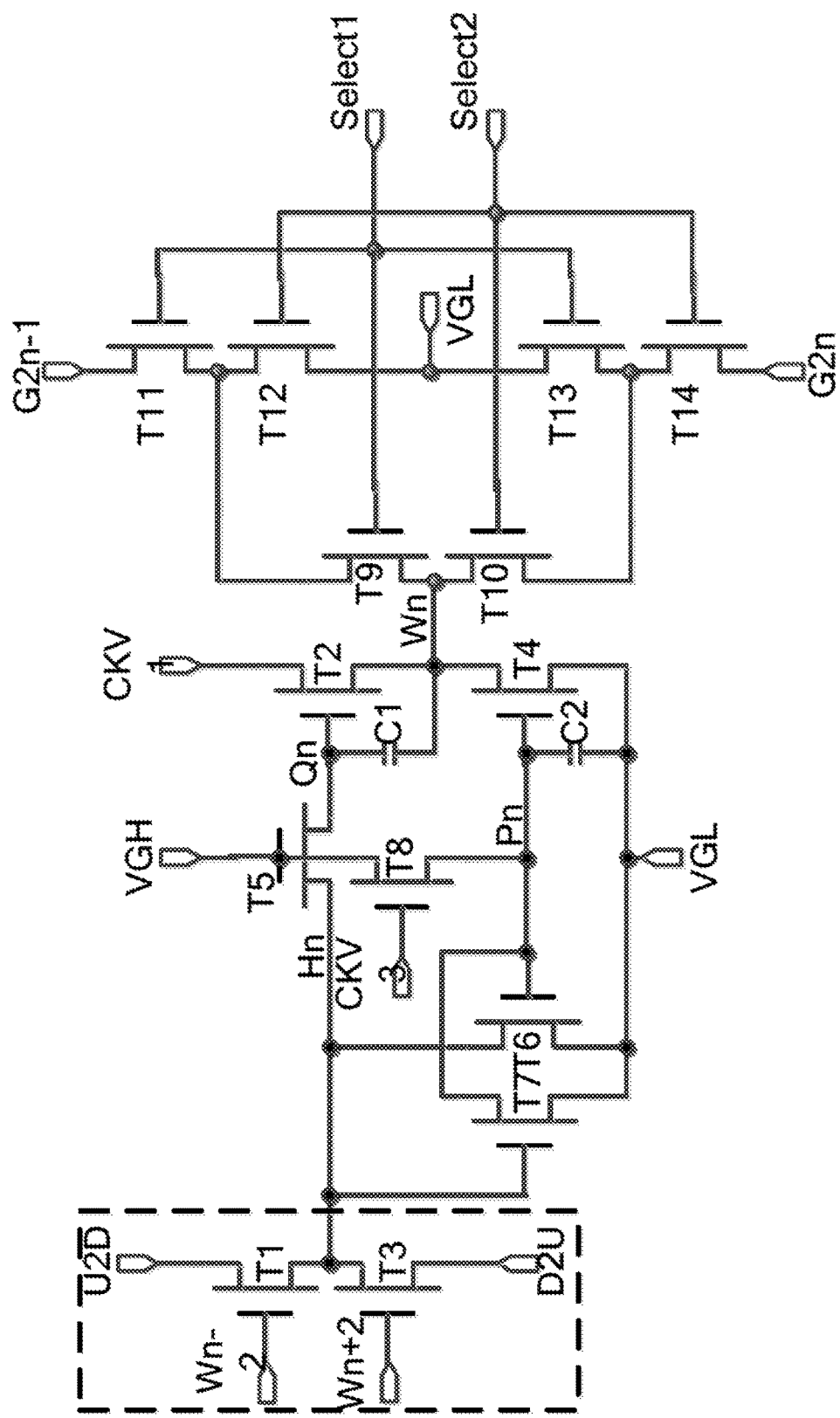
FIG. 8 is a diagram of the first preferred embodiment of a GOA circuit according to the present invention.

Please refer to FIG. 8, which is a diagram of the first preferred embodiment of a GOA circuit according to the present invention. The GOA circuit of the present invention comprises a plurality of GOA circuit units which are cascade coupled, wherein n is set to be a natural number, and the nth level GOA circuit unit in charge of outputting horizontal scan signals of a 2n−1th row and a 2nth row comprises:

a thin film transistor T1, of which a gate is coupled to a node Wn−2 of an n−2th level GOA circuit unit, and a source and a drain are respectively coupled to a node Hn and inputted with a forward scan control signal U2D;

a thin film transistor T2, of which a gate is coupled to a node Qn, and a source and a drain are respectively coupled to a node Wn of an nth level GOA circuit unit and inputted with a clock signal CKV1;

a thin film transistor T3, of which a gate is coupled to a node Wn+2 of an n+2th level GOA circuit unit, and a source and a drain are respectively coupled to the node Hn and inputted with a backward scan control signal D2U;

a thin film transistor T4, of which a gate is coupled to a node Pn, and a source and a drain are respectively coupled to the node Wn of the nth level GOA circuit unit and a constant low voltage level VGL;

a thin film transistor T5, of which a gate is coupled to a constant high voltage level VGH, and a source and a drain are respectively coupled to the node Hn and the node Qn;

a thin film transistor T6, of which a gate is coupled to the node Pn, and a source and a drain are respectively coupled to the node Hn and the constant low voltage level VGL;

a thin film transistor T7, of which a gate is coupled to the node Hn, and a source and a drain are respectively coupled to the node Pn and the constant low voltage level VGL;

an thin film transistor T8, of which a gate is inputted with a clock signal CKV3, and a source and a drain are respectively coupled to the node Pn and the constant high voltage level VGH;

a thin film transistor T9, of which a gate is inputted with a control signal Select1, and a first source/a first drain is coupled to the node Wn of the nth level GOA circuit unit, and a second source/a second drain is coupled to first sources/first drains of a thin film transistor T11 and a thin film transistor T12;

a thin film transistor T10, of which a gate is inputted with a control signal Select2, and a first source/a first drain is coupled to the node Wn of the nth level GOA circuit unit, and a second source/a second drain is coupled to first sources/first drains of a thin film transistor T13 and a thin film transistor T14;

the thin film transistor T11, of which a gate is inputted with the control signal Select1, and a second source/a second drain is coupled to a signal output point G2n−1 of the nth level GOA circuit unit;

the thin film transistor T12, of which a gate is inputted with the control signal Select2, and a second source/a second drain is coupled to the constant low voltage level VGL;

the thin film transistor T13, of which a gate is inputted with the control signal Select1, and a second source/a second drain is coupled to the constant low voltage level VGL;

the thin film transistor T14, of which a gate is inputted with the control signal Select2, and a second source/a second drain is coupled to a signal output point G2n of the nth level GOA circuit unit;

a capacitor C1, of which two ends are respectively coupled to the node Qn and the node Wn of the nth level GOA circuit unit;

a capacitor C2, of which two ends are respectively coupled to the node Pn and the constant low voltage level VGL;

The dotted lines portion in FIG. 8 is a forward-backward scan unit of the GOA circuit.

Figure 9:
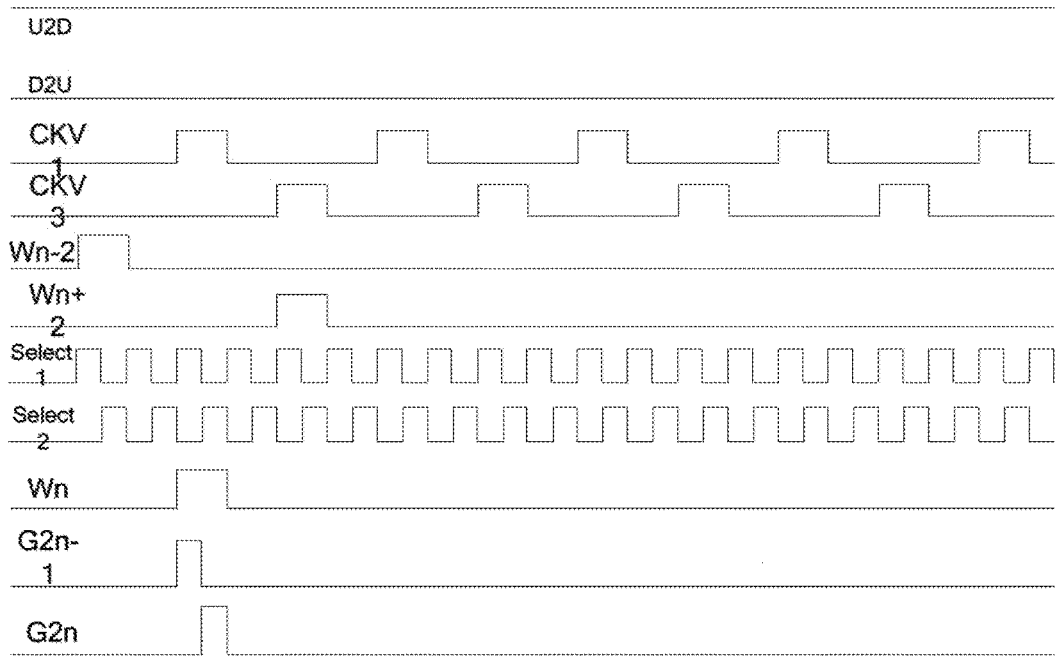
FIG. 9 is a forward scan sequence diagram of the GOA circuit in FIG. 8.

Please refer to FIG. 9, which is a forward scan sequence diagram of the GOA circuit in FIG. 8. With combination of FIG. 8, the specific work process (forward scan) of the circuit is introduced below:

the Wnth level GOA circuit unit of outputting horizontal scan signals of a 2n−1th row and a 2nth row is illustrated; as forward scan, U2D is a high voltage level, and D2U is a low voltage level;

stage 1, pre-charge stage, Wn−2 and U2D are high voltage levels at the same time, and T1 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Wn outputs the high voltage level: in stage 1, the point Qn is pre-charged, and C1 has a certain maintaining function to the electrical charges, and T2 is in an on state, and the high voltage level of CKV1 is outputted to the end Wn;

stage 3, Wn outputs low voltage level: C1 has the maintaining function to the high voltage level to the point Qn, and the low voltage level of CKV1 pulls down the point Wn;

stage 4, the point Qn is pulled down to VGL: as Wn+2 is the high voltage level, D2U is the low voltage level, and T3 is in an on state, and thus, the point Qn is pulled down to be VGL;

stage 5, the point Qn and the point of Wn maintain the low voltage level: after the point Qn becomes the low voltage level, T7 is in an off state, and as CKV3 jumps to the high voltage level, T8 is on, and the point Pn is charge, and then both T4 and T6 are in an on state, which can ensure the low voltage level stabilities of the point Qn and the point Wn, and meanwhile, C2 has a certain maintaining function to the high voltage level of the point Pn.

The main difference of the present invention from the prior art is the introduction of a control unit consisted of T9-T14. As Wn outputs the low voltage level, Select1 corresponds to the high voltage level, and T9, T11 are in an on state, and G2n-1 is pulled down. Select2 corresponds to the high voltage level, and T10, T14 are in an on state, and G2n is pulled down. As Wn outputs the high voltage level, Select1 corresponds to the high voltage level, and T9, T11 are in an on state, and G2n-1 is pulled up. Select2 corresponds to the high voltage level, and T10, T14 are in an on state, and G2n is pulled up.

As shown in FIG. 9, the clock signal CKV1 and the clock signal CKV3 are square waves that duty ratios are 0.25, and phases of the clock signal CKV1 and the clock signal CKV3 are different with a half cycle.

For the first level GOA circuit unit, as the forward scan starts, the first node Wn-2 of the n-2th level GOA circuit unit needs to be inputted with a high voltage level signal to be an activation signal.

Figure 10:
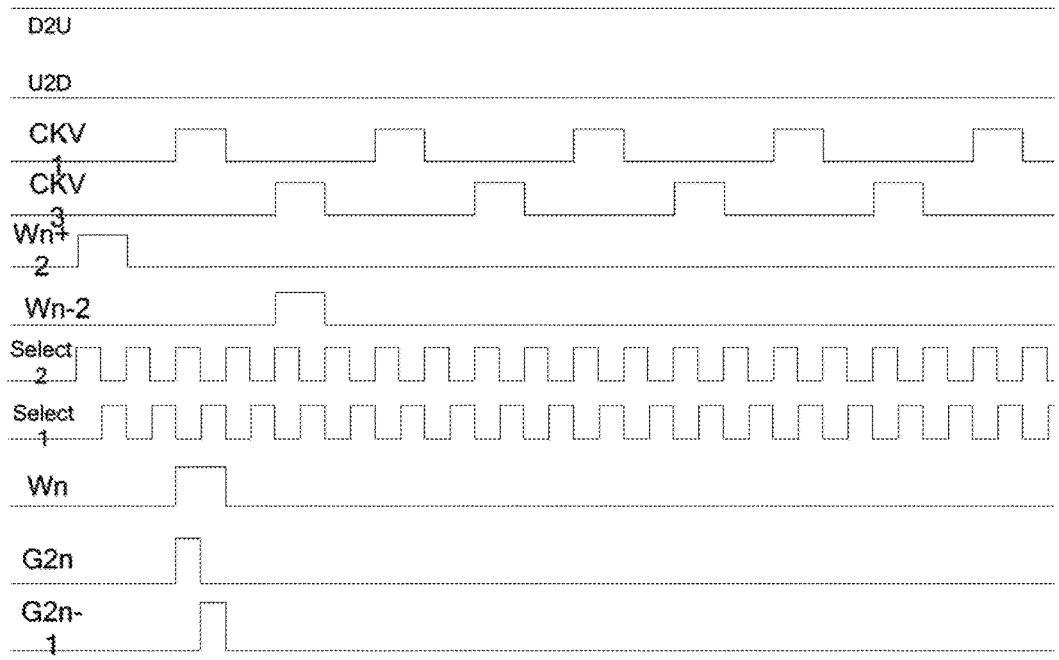
FIG. 10 is a backward scan sequence diagram of the GOA circuit in FIG. 8.

Please refer to FIG. 10, which is a backward scan sequence diagram of the GOA circuit in FIG. 8. With combination of FIG. 8, the specific work process (backward scan) of the circuit is introduced below:

the Wnth level GOA circuit unit of outputting horizontal scan signals of a 2n-1th row and a 2nth row is illustrated; as forward scan, D2U is a high voltage level, and U2D is a low voltage level;

stage 1, pre-charge stage, Wn+2 and D2U are high voltage levels at the same time, and T3 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Wn outputs the high voltage level: in stage 1, the point Qn is pre-charged, and C1 has a certain maintaining function to the electrical charges, and T2 is in an on state, and the high voltage level of CKV1 is outputted to the end Wn;

stage 3, Wn outputs low voltage level: C1 has the maintaining function to the high voltage level to the point Qn, and the low voltage level of CKV1 pulls down the point Wn;

stage 4, the point Qn is pulled down to VGL: as Gn-2 is high voltage level, U2D is low voltage level, and T1 is in an on state, and thus, the point Qn is pulled down to be VGL;

stage 5, the point Qn and the point of Wn maintain the low voltage level: after the point Qn becomes the low voltage level, T7 is in an off state, and as CKV3 jumps to the high voltage level, T8 is on, and the point Pn is charge, and then both T4 and T6 are in an on state, which can ensure the low voltage level stabilities of the point Qn and the point Wn, and meanwhile, C2 has a certain maintaining function to the high voltage level of the point Pn.

The main difference of the present invention from the prior art is the introduction of a control unit consisted of T9-T14. As Wn outputs the low voltage level, Select2 corresponds to the high voltage level, and T10, T14 are in an on state, and G2n is pulled down. Select1 corresponds to the high voltage level, and T9, T11 are in an on state, and G2n-1 is pulled down. As Wn outputs the high voltage level, Select2 corresponds to the high voltage level, and T10, T14 are in an on state, and G2n is pulled up. Select1 corresponds to the high voltage level, and T9, T11 are in an on state, and G2n-1 is pulled up.

For the last level GOA circuit unit, as the backward scan starts, the first node Wn+2 of the n+2th level GOA circuit unit needs to be inputted with a high voltage level signal to be an activation signal.

The first preferred embodiment of the present invention proposes the addition of some control unit on the basis of the present GOA structure to divide the output of some one level GOA into the outputs of two levels GOAs with the control unit. Then, in comparison with prior art that the outputs of the two levels GOAs require the manner of two cascaded two levels GOA circuits, it can reduce the layout space occupied by the GOA in a certain level for having a certain help to the development of the narrow frame technology.

Figure 1:
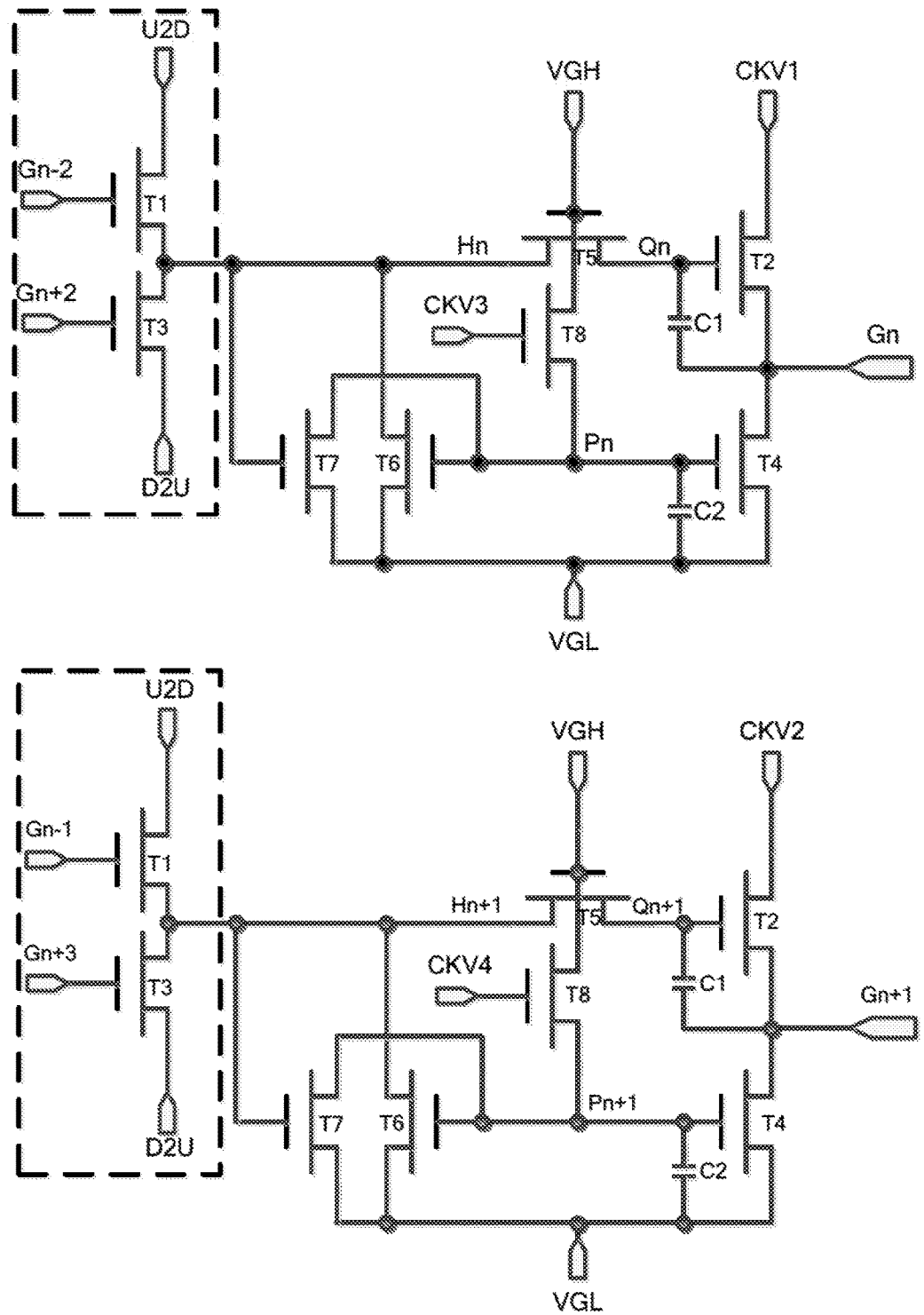
FIG. 1 is a diagram of a GOA circuit according to prior art.
Figure 2:
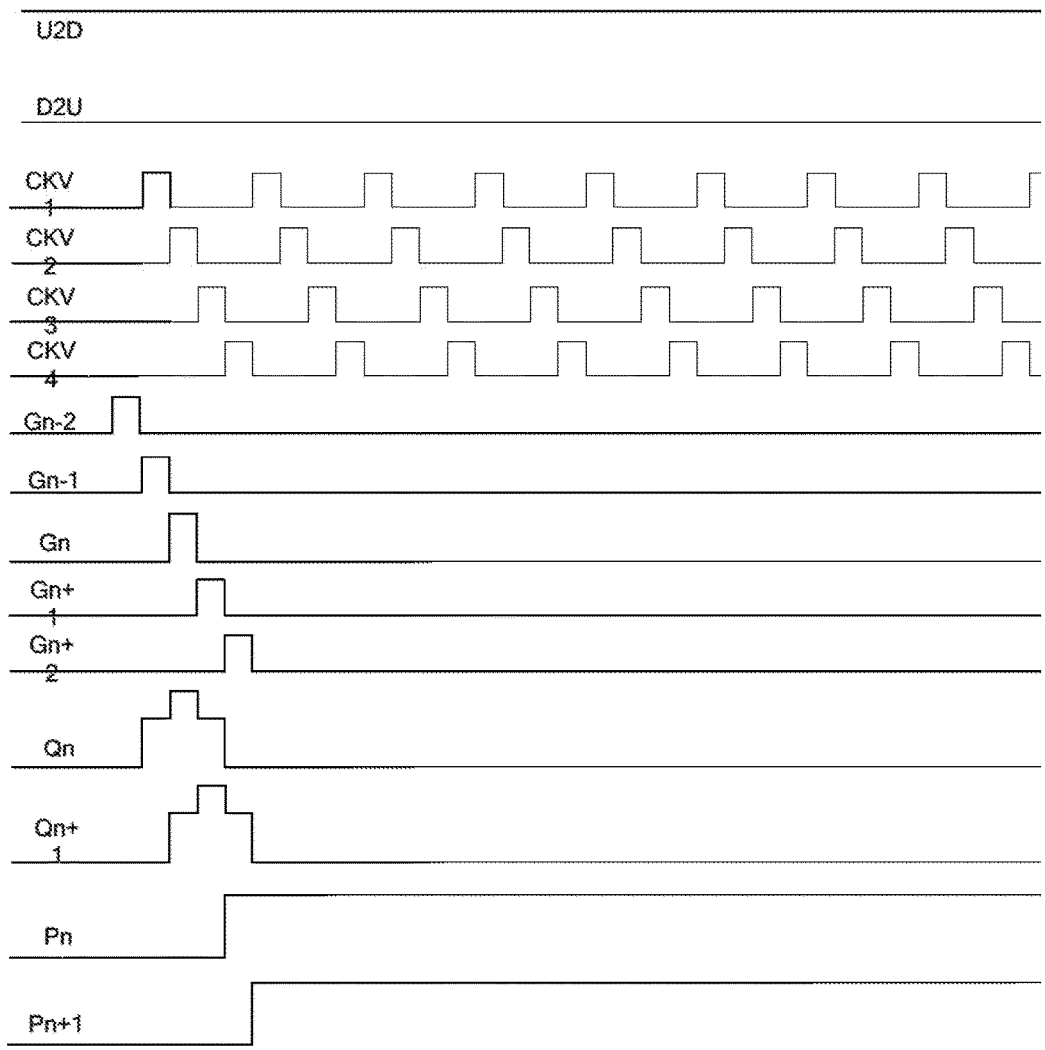
FIG. 2 is a forward scan sequence diagram of the GOA circuit in FIG. 1.
Figure 3:
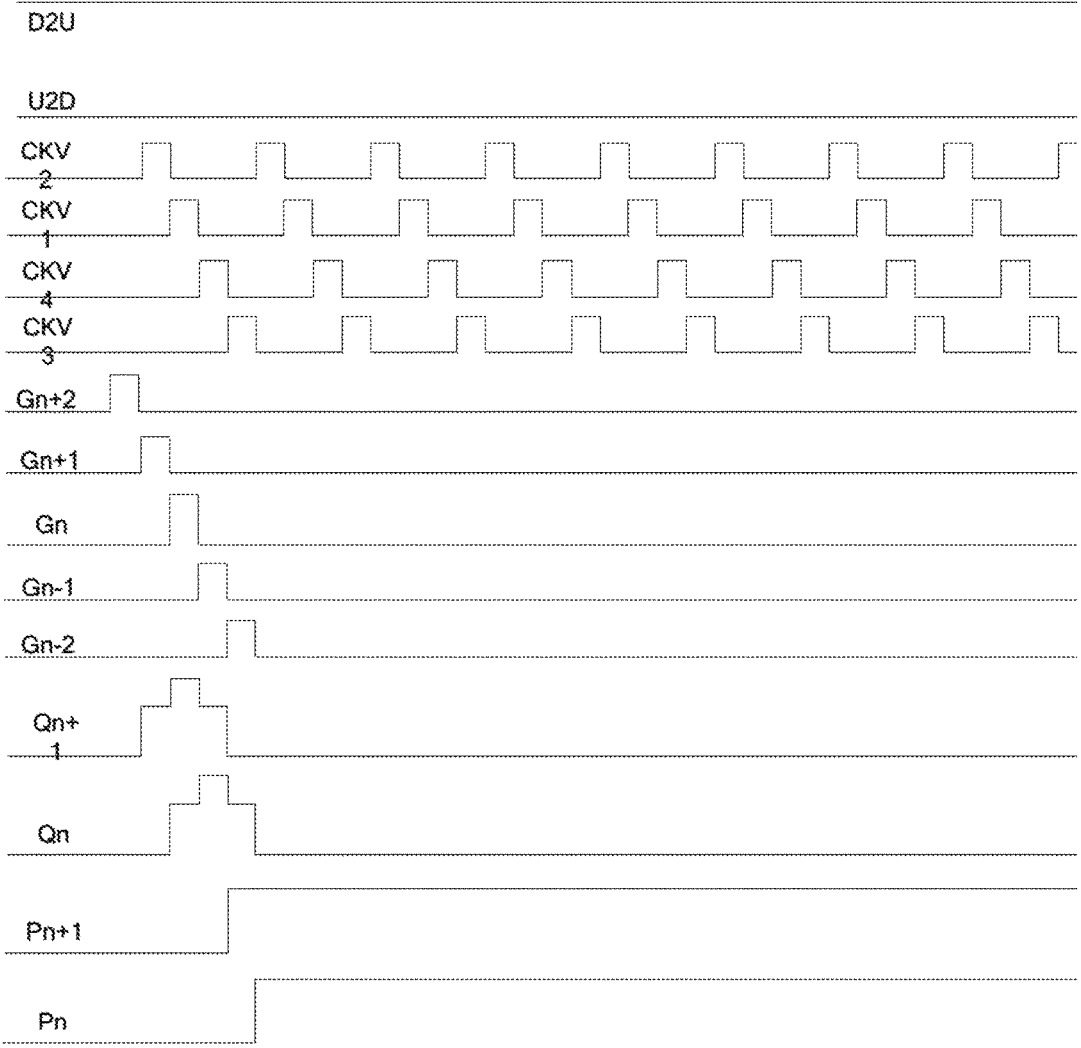
FIG. 3 is a backward scan sequence diagram of the GOA circuit in FIG. 1.
Figure 4:
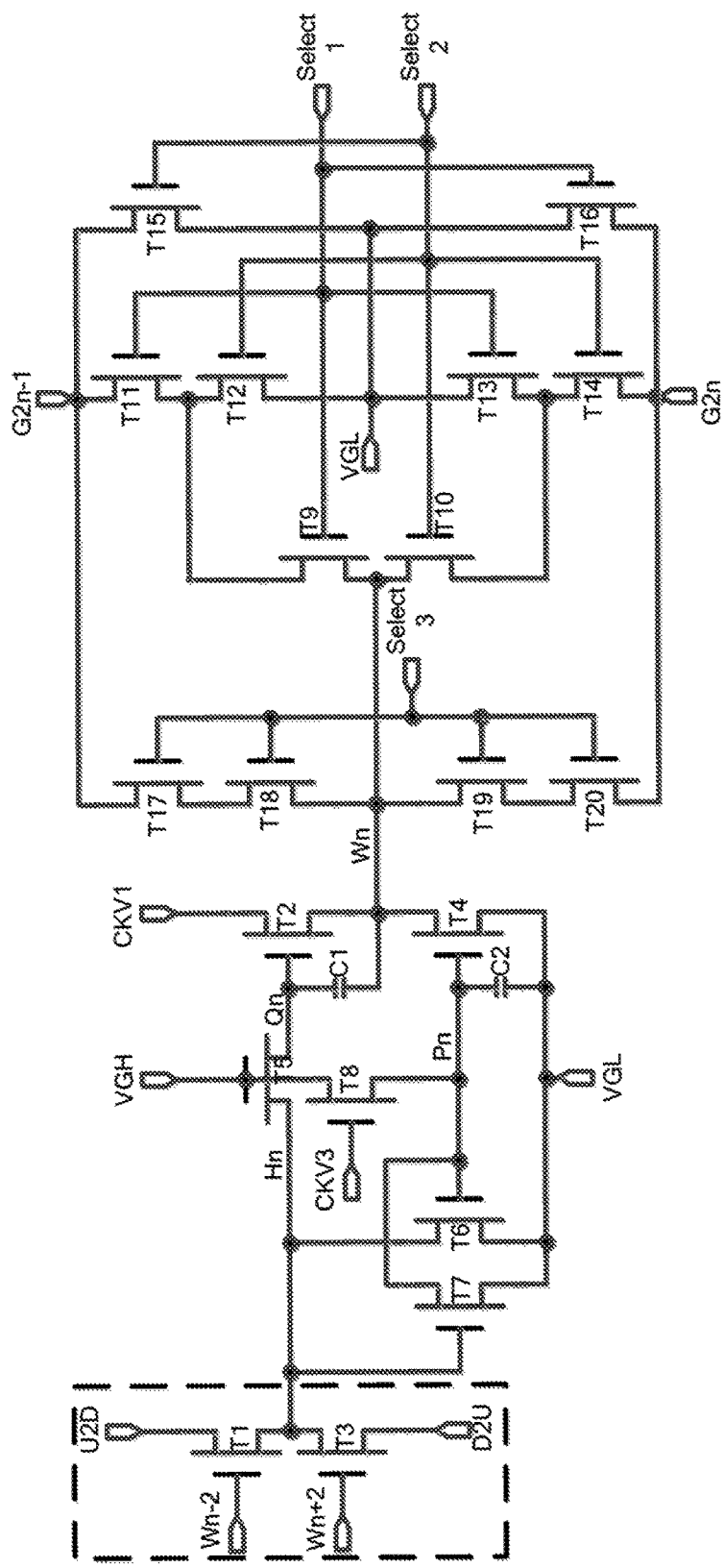
FIG. 4 is a diagram of the second preferred embodiment of a GOA circuit according to the present invention.

Please refer to FIG. 4, which is a diagram of the second preferred embodiment of a GOA circuit according to the present invention. The GOA circuit of the present invention comprises a plurality of GOA circuit units which are cascade coupled, wherein n is set to be a natural number, and the nth level GOA circuit unit in charge of outputting horizontal scan signals of a 2n-1th row and a 2nth row comprises:

a thin film transistor T1, of which a gate is coupled to a node Wn-2 of an n-2th level GOA circuit unit, and a source and a drain are respectively coupled to a node Hn and inputted with a forward scan control signal U2D;

a thin film transistor T2, of which a gate is coupled to a node Qn, and a source and a drain are respectively coupled to a node Wn of an nth level GOA circuit unit and inputted with a clock signal CKV1;

a thin film transistor T3, of which a gate is coupled to a node Wn+2 of a n+2th level GOA circuit unit, and a source and a drain are respectively coupled to the node Hn and inputted with a backward scan control signal D2U;

a thin film transistor T4, of which a gate is coupled to a node Pn, and a source and a drain are respectively coupled to the node Wn of the nth level GOA circuit unit and a constant low voltage level VGL;

a thin film transistor T5, of which a gate is coupled to a constant high voltage level VGH, and a source and a drain are respectively coupled to the node Hn and the node Qn;

a thin film transistor T6, of which a gate is coupled to the node Pn, and a source and a drain are respectively coupled to the node Hn and the constant low voltage level VGL;

a thin film transistor T7, of which a gate is coupled to the node Hn, and a source and a drain are respectively coupled to the node Pn and the constant low voltage level VGL;

an thin film transistor T8, of which a gate is inputted with a clock signal CKV3, and a source and a drain are respectively coupled to the node Pn and the constant high voltage level VGH;

a thin film transistor T9, of which a gate is inputted with a control signal Select1, and a first source/a first drain is coupled to the node Wn of the nth level GOA circuit unit, and a second source/a second drain is coupled to first sources/first drains of a thin film transistor T11 and a thin film transistor T12;

a thin film transistor T10, of which a gate is inputted with a control signal Select2, and a first source/a first drain is coupled to the node Wn of the nth level GOA circuit unit, and a second source/a second drain is coupled to first sources/first drains of a thin film transistor T13 and a thin film transistor T14;

the thin film transistor T11, of which a gate is inputted with the control signal Select1, and a second source/a second drain is coupled to a signal output point G2n-1 of the nth level GOA circuit unit;

the thin film transistor T12, of which a gate is inputted with the control signal Select2, and a second source/a second drain is coupled to the constant low voltage level VGL;

the thin film transistor T13, of which a gate is inputted with the control signal Select1, and a second source/a second drain is coupled to the constant low voltage level VGL;

the thin film transistor T14, of which a gate is inputted with the control signal Select2, and a second source/a second drain is coupled to a signal output point G2n of the nth level GOA circuit unit;

the thin film transistor T15, of which a gate is inputted with the control signal Select2, and a source and a drain are respectively coupled to a signal output point G2n-1 of the nth level GOA circuit unit and the constant low voltage level VGL;

the thin film transistor T16, of which a gate is inputted with the control signal Select1, and a source and a drain are respectively coupled to the signal output point G2n of the nth level GOA circuit unit and the constant low voltage level VGL;

a seventeenth thin film transistor T17, of which a gate is inputted with a control signal Select3, and a source and a drain are respectively coupled to the signal output point G2n-1 of the nth level GOA circuit unit and a first source/a first drain of a thin film transistor T18;

the eighteenth thin film transistor T18, of which a gate is inputted with the control signal Select3, and a second source/a second drain is coupled to the node Wn of the nth level GOA circuit unit;

a thin film transistor T19, of which a gate is inputted with a control signal Select3, and a first source/a first drain is coupled to the node Wn of the nth level GOA circuit unit, and a second source/a second drain is coupled to a first source/a first drain of a thin film transistor T20;

the thin film transistor T20, of which a gate is inputted with the control signal Select3, and a second source/a second drain is coupled to the signal output point G2n of the nth level GOA circuit unit;

a capacitor C1, of which two ends are respectively coupled to the node Qn and the node Wn of the nth level GOA circuit unit;

a capacitor C2, of which two ends are respectively coupled to the node Pn and the constant low voltage level VGL;

The dotted lines portion in FIG. 4 is a forward-backward scan unit of the GOA circuit.

Figure 5:
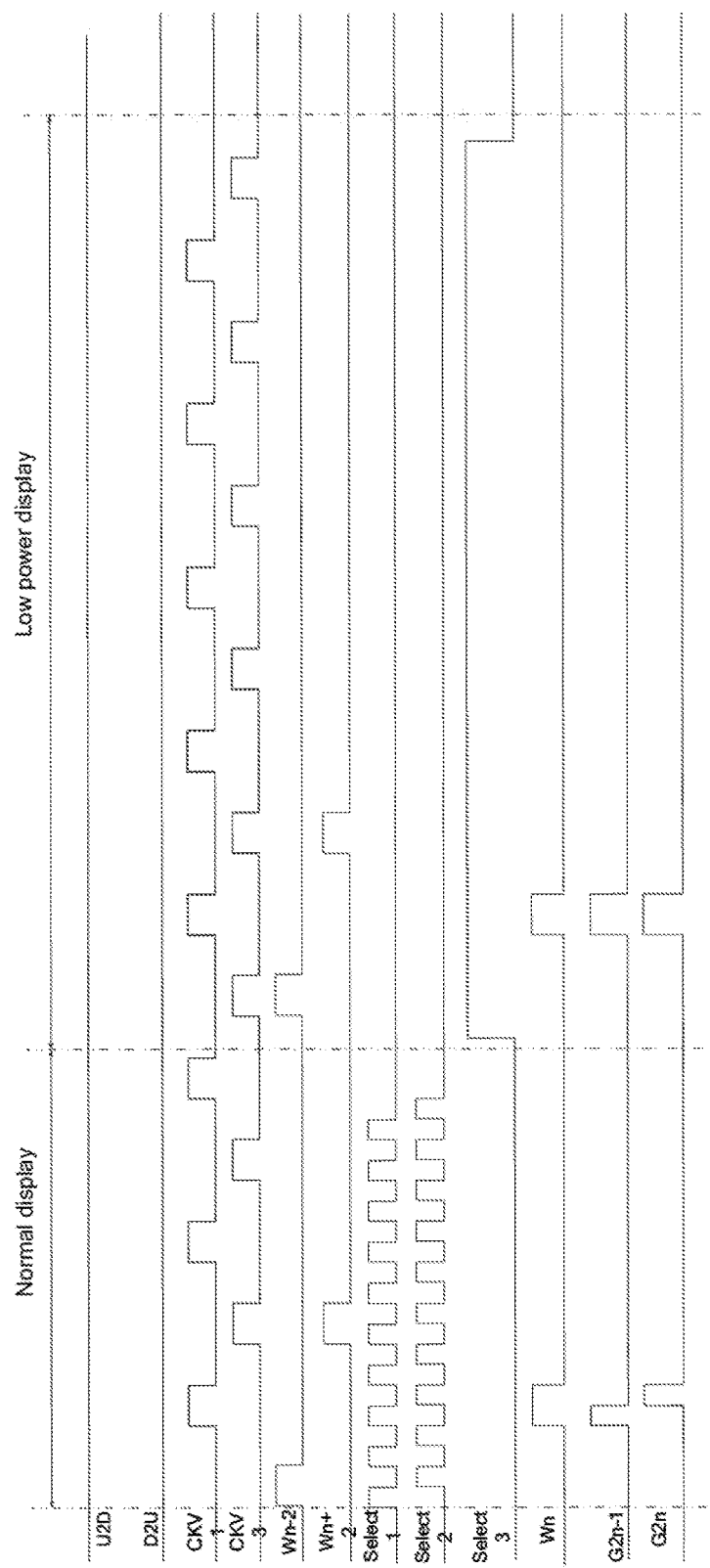
FIG. 5 is a forward scan sequence diagram of the GOA circuit in FIG. 4.

Please refer to FIG. 5, which is a forward scan sequence diagram of the GOA circuit in FIG. 4. With combination of FIG. 4, the specific work process (forward scan) of the circuit is introduced below:

In a normal display state, Select1 and Select2 are alternately to be the high voltage level, and Select3 is the low voltage level all the time, the Wnth level GOA circuit unit of outputting horizontal scan signals of a 2n-1th row and a 2nth row is illustrated; as forward scan, U2D is a high voltage level, and D2U is a low voltage level;

stage 1, pre-charge stage, Wn-2 and U2D are high voltage levels at the same time, and T1 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Wn outputs the high voltage level: in stage 1, the point Qn is pre-charged, and C1 has a certain maintaining function to the electrical charges, and T2 is in an on state, and the high voltage level of CKV1 is outputted to the end Wn;

stage 3, Wn outputs low voltage level: C1 has the maintaining function to the high voltage level to the point Qn, and the low voltage level of CKV1 pulls down the point Wn;

stage 4, the point Qn is pulled down to VGL: as Wn+2 is the high voltage level, D2U is the low voltage level, and T3 is in an on state, and thus, the point Qn is pulled down to be VGL;

stage 5, the point Qn and the point of Wn maintain the low voltage level: after the point Qn becomes the low voltage level, T7 is in an off state, and as CKV3 jumps to the high voltage level, T8 is on, and the point Pn is charge, and then both T4 and T6 are in an on state, which can ensure the low voltage level stabilities of the point Qn and the point Wn, and meanwhile, C2 has a certain maintaining function to the high voltage level of the point Pn.

As Wn outputs the low voltage level in the present invention, Select1 corresponds to the high voltage level, and T9, T11 are in an on state, and G2n-1 is pulled down. Select2 corresponds to the high voltage level, and T10, T14 are in an on state, and G2n is pulled down. As Wn outputs the high voltage level, Select1 corresponds to the high voltage level, and T9, T11 are in an on state, and G2n-1 is pulled up. Select2 corresponds to the high voltage level, and T10, T14 are in an on state, and G2n is pulled up.

In such process, Select3 outputs the low voltage level all the time, and T17-T20 are in an off state all the time.

In a low power display state, both Select1 and Select2 are low voltage levels, and Select3 is a high voltage level all the time.

Because Select1 and Select2 are at the low voltage level all the time, and all T9-T16 are in an off state, and then Select3 is the high voltage level, and all T17-T20 are in an on state, and as Wn outputs the high voltage level, G2n-1 and G2n output the high voltage levels at the same time.

As shown in FIG. 5, the clock signal CKV1 and the clock signal CKV3 are square waves that duty ratios are 0.25, and phases of the clock signal CKV1 and the clock signal CKV3 are different with a half cycle.

For the first level GOA circuit unit, as the forward scan starts, the first node Wn-2 of the n-2th level GOA circuit unit needs to be inputted with a high voltage level signal to be an activation signal.

Figure 6:
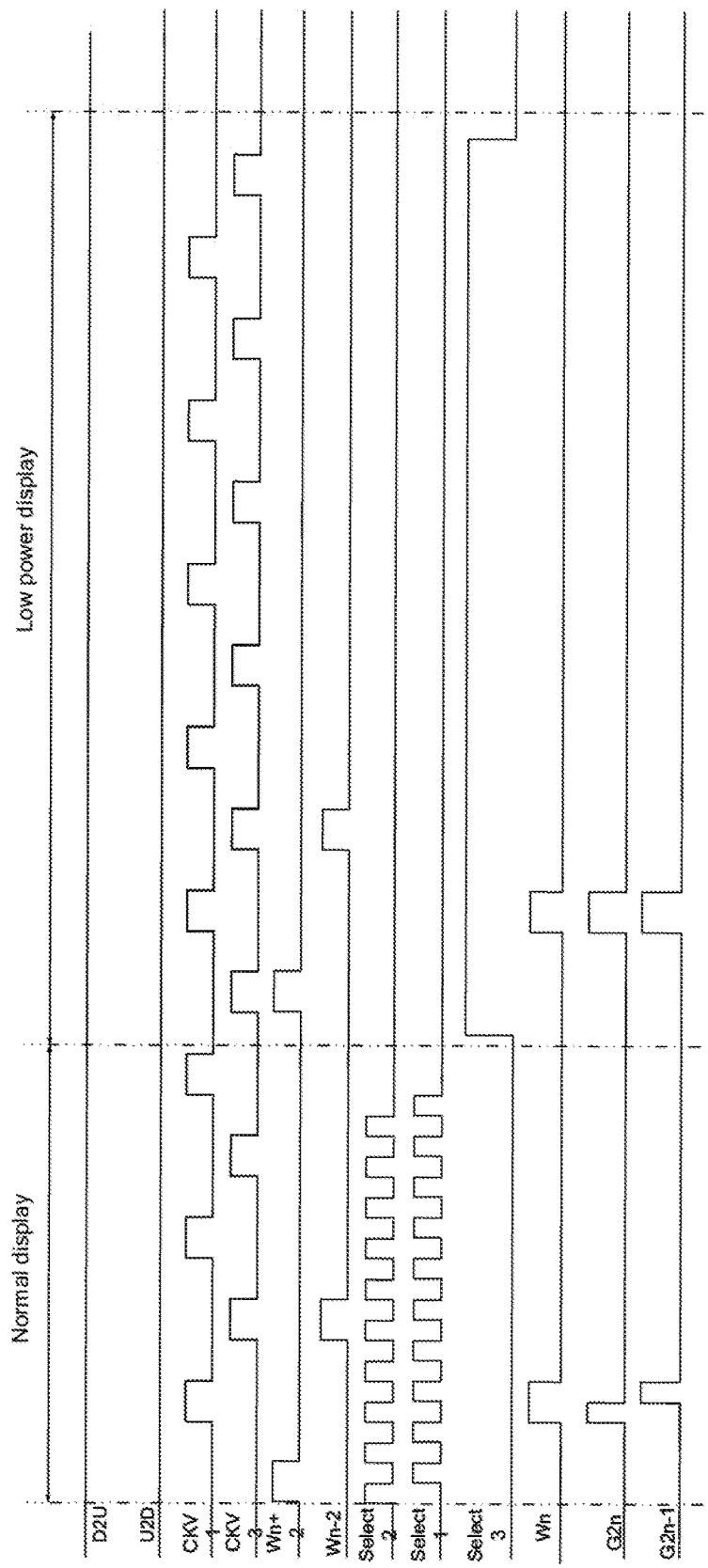
FIG. 6 is a backward scan sequence diagram of the GOA circuit in FIG. 4.

Please refer to FIG. 6, which is a backward scan sequence diagram of the GOA circuit in FIG. 4. With combination of FIG. 4, the specific work process (backward scan) of the circuit is introduced below:

In a normal display state, Select1 and Select2 are alternately to be the high voltage level, and Select3 is the low voltage level all the time, the Wnth level GOA circuit unit of outputting horizontal scan signals of a 2n-1th row and a 2nth row is illustrated; as forward scan, D2U is a high voltage level, and U2D is a low voltage level;

stage 1, pre-charge stage, Wn+2 and D2U are high voltage levels at the same time, and T3 is on, and the point Hn is pre-charged. As the point Hn is the high voltage level, T5 is in an on state, and the point Qn is pre-charged. As the point Hn is the high voltage level, T7 is in an on state, and the point Pn is pulled down;

stage 2, Wn outputs the high voltage level: in stage 1, the point Qn is pre-charged, and C1 has a certain maintaining function to the electrical charges, and T2 is in an on state, and the high voltage level of CKV1 is outputted to the end Wn;

stage 3, Wn outputs low voltage level: C1 has the maintaining function to the high voltage level to the point Qn, and the low voltage level of CKV1 pulls down the point Wn;

stage 4, the point Qn is pulled down to VGL: as Gn-2 is high voltage level, U2D is low voltage level, and T1 is in an on state, and thus, the point Qn is pulled down to be VGL;

stage 5, the point Qn and the point of Wn maintain the low voltage level: after the point Qn becomes the low voltage level, T7 is in an off state, and as CKV3 jumps to the high voltage level, T8 is on, and the point Pn is charge, and then both T4 and T6 are in an on state, which can ensure the low voltage level stabilities of the point Qn and the point Wn, and meanwhile, C2 has a certain maintaining function to the high voltage level of the point Pn.

As Wn outputs the low voltage level in the present invention, Select2 corresponds to the high voltage level, and T10, T14 are in an on state, and G2n is pulled down. Select1 corresponds to the high voltage level, and T9, T11 are in an on state, and G2n−1 is pulled down. As Wn outputs the high voltage level, Select2 corresponds to the high voltage level, and T10, T14 are in an on state, and G2n is pulled up. Select1 corresponds to the high voltage level, and T9, T11 are in an on state, and G2n−1 is pulled up.

In such process, Select3 outputs the low voltage level all the time, and T17-T20 are in an off state all the time.

In a low power display state, both Select1 and Select2 are low voltage levels, and Select3 is a high voltage level all the time.

Because Select1 and Select2 are at the low voltage level all the time, and all T9-T16 are in an off state, and then Select3 is the high voltage level, and all T17-T20 are in an on state, and as Wn outputs the high voltage level, G2n−1 and G2n output the high voltage levels at the same time.

For the last level GOA circuit unit, as the backward scan starts, the first node Wn+2 of the n+2th level GOA circuit unit needs to be inputted with a high voltage level signal to be an activation signal.

Figure 7:
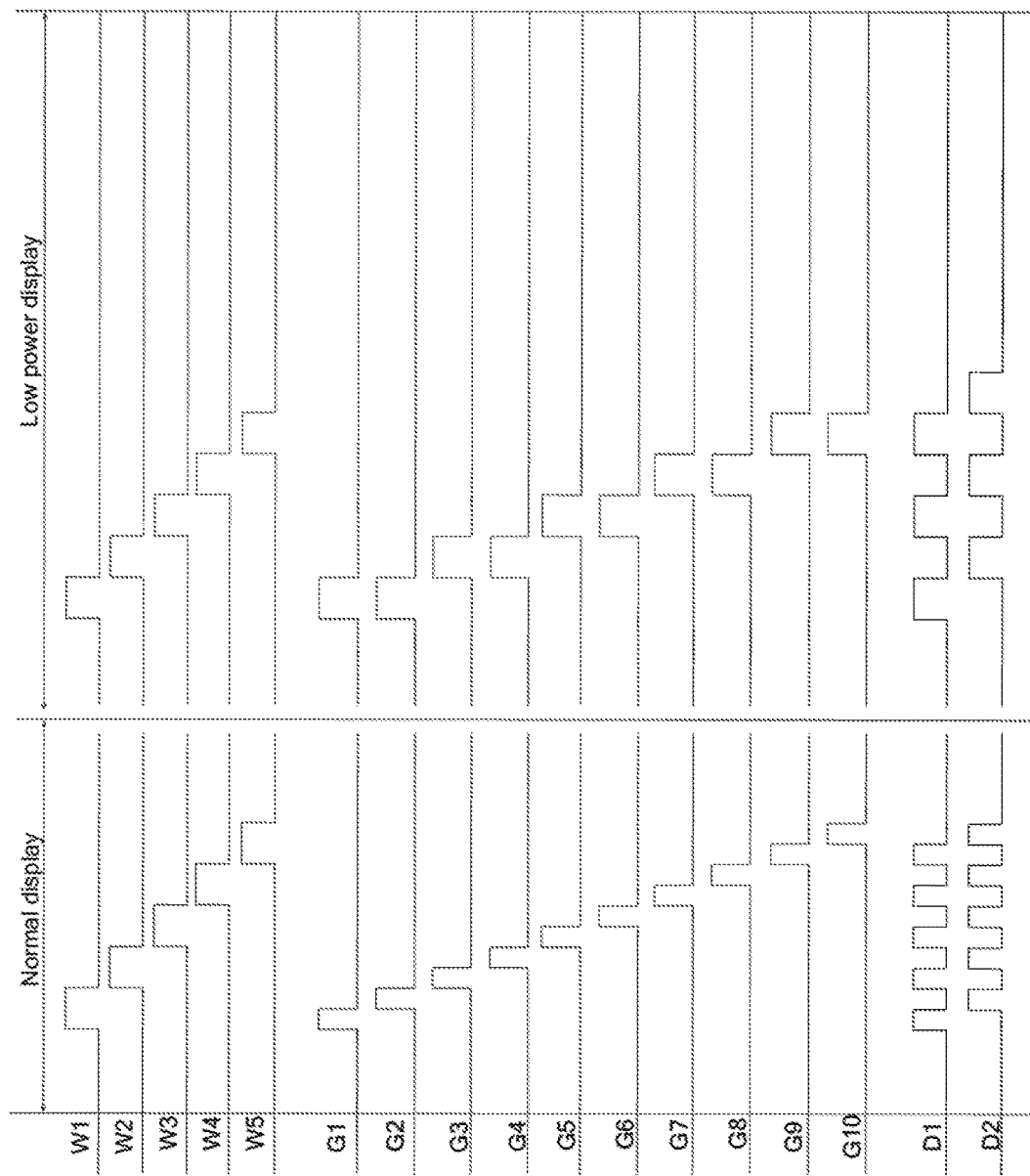
FIG. 7 is a diagram of the second preferred embodiment of a GOA circuit according to the present invention corresponding to data drive.

FIG. 7 is a diagram of the second preferred embodiment of a GOA circuit according to the present invention corresponding to data drive. As shown in FIGS. 4-6, the second preferred embodiment adds a control unit on the basis of the GOA structure of prior art. 3 control signals Select1, Select2, Select3 are introduced on the basis of the present GOA circuit, wherein Select1 and Select2 are a set of signals of which phases are opposite, and the main function is to divide the gate output of the GOA circuit into two; in some special display mode: such as the standby mode or the power saving mode, Select3 outputs the high voltage level as both Select1 and Select2 outputs the low voltage levels to change the output of two levels becoming the same output signal, and in another words, the gate outputs of the first level and the second level are the same, and the gate outputs of the third level and the fourth level are same, and so on. Accordingly, the frequency corresponded with Data signal will be halved, and the corresponding drive power consumption will be decreased.

The known and potential technology/product application field and the application thereof of the GOA circuit of the present invention are below: 1. liquid crystal display row scan (Gate) drive circuit integrated on the array substrate; 2 gate drive field applied for mobile phone, display and television; 3, advanced technology covering the LCD and OLED industries; 4, high resolution panel design, in which the stability of the present circuit is suitable.

In conclusion, the present invention provides a GOA circuit, which can effectively reduce the layout space occupied by the GOA circuit for having a certain help to the development of the narrow frame technology; it can reduce the drive power consumption of the panel in some special display mode.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A Gate Driver On Array (GOA) circuit, comprising a plurality of GOA circuit units which are cascade coupled, wherein n is set to be a natural number, and the nth level GOA circuit unit in charge of outputting horizontal scan signals of a 2n−1th row and a 2nth row comprises:
   a first thin film transistor, of which a gate is coupled to a first node of an n−2th level GOA circuit unit, and a source and a drain of the first thin film transistor are directly coupled respectively to a second node and inputted with a forward scan control signal;
   a second thin film transistor, of which a gate is coupled to a third node, and a source and a drain of the second thin film transistor are directly coupled respectively to a first node of an nth level GOA circuit unit and inputted with a first clock signal;
   a third thin film transistor, of which a gate is coupled to a first node of an n+2th level GOA circuit unit, and a source and a drain of the third thin film transistor are directly coupled respectively to the second node and inputted with a backward scan control signal;
   a fourth thin film transistor, of which a gate is coupled to a fourth node, and a source and a drain of the fourth thin film transistor are directly coupled respectively to the first node of the nth level GOA circuit unit and a constant low voltage level;
   a fifth thin film transistor, of which a gate is coupled to a constant high voltage level, and a source and a drain of the fifth thin film transistor are directly coupled respectively to the second node and the third node;
   a sixth thin film transistor, of which a gate is coupled to the fourth node, and a source and a drain of the sixth thin film transistor are directly coupled respectively to the second node and the constant low voltage level;
   a seventh thin film transistor, of which a gate is coupled to the second node, and a source and a drain of the seventh thin film transistor are directly coupled respectively to the fourth node and the constant low voltage level;
   an eighth thin film transistor, of which a gate is inputted with a second clock signal, and a source and a drain of the eighth thin film transistor are directly coupled respectively to the fourth node and the constant high voltage level;
   a ninth thin film transistor, of which a gate is inputted with a first control signal, and a first source/a first drain of the ninth thin film transistor is directly coupled to the first node of the nth level GOA circuit unit, and a second source/a second drain of the ninth thin film transistor is directly coupled to first sources/first drains of an eleventh thin film transistor and a twelfth thin film transistor;
   a tenth thin film transistor, of which a gate is inputted with a second control signal, and a first source/a first drain of the tenth thin film transistor is directly coupled to the first node of the nth level GOA circuit unit, and a second source/a second drain of the tenth thin film transistor is directly coupled to first sources/first drains of a thirteenth thin film transistor and a fourteenth thin film transistor;
   the eleventh thin film transistor, of which a gate is inputted with the first control signal, and a second source/a second drain of the eleventh thin film transistor is directly coupled to a first signal output point of the nth level GOA circuit unit;

the twelfth thin film transistor, of which a gate is inputted with the second control signal, and a second source/a second drain of the twelfth thin film transistor is directly coupled to the constant low voltage level;

the thirteenth thin film transistor, of which a gate is inputted with the first control signal, and a second source/a second drain of the thirteenth thin film transistor is directly coupled to the constant low voltage level;

the fourteenth thin film transistor, of which a gate is inputted with the second control signal, and a second source/a second drain of the fourteenth thin film transistor is directly coupled to a second signal output point of the nth level GOA circuit unit;

a first capacitor, of which two ends are respectively coupled to the third node and the first node of the nth level GOA circuit unit;

a second capacitor, of which two ends are respectively coupled to the fourth node and the constant low voltage level.

2. The GOA circuit according to claim 1, wherein the nth level GOA circuit unit further comprises:

a fifteenth thin film transistor, of which a gate is inputted with the second control signal, and a second source and a second drain are respectively coupled to the first signal output point of the nth level GOA circuit unit and the constant low voltage level;

a sixteenth thin film transistor, of which a gate is inputted with the first control signal, and a source and a drain are respectively coupled to the second signal output point of the nth level GOA circuit unit and the constant low voltage level;

a seventeenth thin film transistor, of which a gate is inputted with a third control signal, and a source and a drain are respectively coupled to the first signal output point of the nth level GOA circuit unit and a first source/a first drain of an eighteenth thin film transistor;

the eighteenth thin film transistor, of which a gate is inputted with the third control signal, and a second source/a second drain is coupled to the first node of the nth level GOA circuit unit;

a nineteenth thin film transistor, of which a gate is inputted with the third control signal, and a first source/a first drain is coupled to the first node of the nth level GOA circuit unit, and a second source/a second drain is coupled to a first source/a first drain of a twentieth thin film transistor;

the twentieth thin film transistor, of which a gate is inputted with the third control signal, and a second source/a second drain is coupled to the second signal output point of the nth level GOA circuit unit.

3. The GOA circuit according to claim 2, wherein in a normal display state, the first control signal and the second control signal are alternately to be a high voltage level, and the third control signal is a low voltage level all the time.

4. The GOA circuit according to claim 2, wherein in a low power display state, both the first control signal and the second control signal are low voltage levels, and the third control signal is a high voltage level all the time.

5. The GOA circuit according to claim 4, wherein the low power display state is a standby mode.

6. The GOA circuit according to claim 4, wherein the low power display state is a power saving mode.

7. The GOA circuit according to claim 1, wherein the first clock signal and the second clock signal are square waves that duty ratios are 0.25, and phases of the first clock signal and the second clock signal are different with a half cycle.

8. The GOA circuit according to claim 1, wherein for the first level GOA circuit unit, as the forward scan starts, the first node of the n−2th level GOA circuit unit is inputted with a high voltage level signal to be an activation signal.

9. The GOA circuit according to claim 1, wherein for the last level GOA circuit unit, as the backward scan starts, the first node of the n+2th level GOA circuit unit is inputted with a high voltage level signal to be an activation signal.

10. A Gate Driver On Array (GOA) circuit, comprising a plurality of GOA circuit units which are cascade coupled, wherein n is set to be a natural number, and the nth level GOA circuit unit in charge of outputting horizontal scan signals of a 2n−1th row and a 2nth row comprises:

a first thin film transistor, of which a gate is coupled to a first node of an n−2th level GOA circuit unit, and a source and a drain of the first thin film transistor are directly coupled respectively to a second node and inputted with a forward scan control signal;

a second thin film transistor, of which a gate is coupled to a third node, and a source and a drain of the second thin film transistor are directly coupled respectively to a first node of an nth level GOA circuit unit and inputted with a first clock signal;

a third thin film transistor, of which a gate is coupled to a first node of an n+2th level GOA circuit unit, and a source and a drain of the third thin film transistor are directly coupled respectively to the second node and inputted with a backward scan control signal;

a fourth thin film transistor, of which a gate is coupled to a fourth node, and a source and a drain of the fourth thin film transistor are directly coupled respectively to the first node of the nth level GOA circuit unit and a constant low voltage level;

a fifth thin film transistor, of which a gate is coupled to a constant high voltage level, and a source and a drain of the fifth thin film transistor are directly coupled respectively to the second node and the third node;

a sixth thin film transistor, of which a gate is coupled to the fourth node, and a source and a drain of the sixth thin film transistor are directly coupled respectively to the second node and the constant low voltage level;

a seventh thin film transistor, of which a gate is coupled to the second node, and a source and a drain of the seventh thin film transistor are directly coupled respectively to the fourth node and the constant low voltage level;

an eighth thin film transistor, of which a gate is inputted with a second clock signal, and a source and a drain of the eighth thin film transistor are directly coupled respectively to the fourth node and the constant high voltage level;

a ninth thin film transistor, of which a gate is inputted with a first control signal, and a first source/a first drain of the ninth thin film transistor is directly coupled to the first node of the nth level GOA circuit unit, and a second source/a second drain of the ninth thin film transistor is directly coupled to first sources/first drains of an eleventh thin film transistor and a twelfth thin film transistor;

a tenth thin film transistor, of which a gate is inputted with a second control signal, and a first source/a first drain of the tenth thin film transistor is directly coupled to the first node of the nth level GOA circuit unit, and a second source/a second drain of the tenth thin film transistor is directly coupled to first sources/first drains of a thirteenth thin film transistor and a fourteenth thin film transistor;

the eleventh thin film transistor, of which a gate is inputted with the first control signal, and a second source/a second drain of the eleventh thin film transistor is directly coupled to a first signal output point of the nth level GOA circuit unit;

the twelfth thin film transistor, of which a gate is inputted with the second control signal, and a second source/a second drain of the twelfth thin film transistor is directly coupled to the constant low voltage level;

the thirteenth thin film transistor, of which a gate is inputted with the first control signal, and a second source/a second drain of the thirteenth thin film transistor is directly coupled to the constant low voltage level;

the fourteenth thin film transistor, of which a gate is inputted with the second control signal, and a second source/a second drain of the fourteenth thin film transistor is directly coupled to a second signal output point of the nth level GOA circuit unit;

a first capacitor, of which two ends are respectively coupled to the third node and the first node of the nth level GOA circuit unit;

a second capacitor, of which two ends are respectively coupled to the fourth node and the constant low voltage level;

wherein the nth level GOA circuit unit further comprises:

a fifteenth thin film transistor, of which a gate is inputted with the second control signal, and a second source and a second drain of the fifteenth thin film transistor directly are respectively coupled to the first signal output point of the nth level GOA circuit unit and the constant low voltage level;

a sixteenth thin film transistor, of which a gate is inputted with the first control signal, and a source and a drain of the sixteenth thin film transistor are directly coupled respectively to the second signal output point of the nth level GOA circuit unit and the constant low voltage level;

a seventeenth thin film transistor, of which a gate is inputted with a third control signal, and a source and a drain of the seventeenth thin film transistor are directly coupled respectively to the first signal output point of the nth level GOA circuit unit and a first source/a first drain of an eighteenth thin film transistor;

the eighteenth thin film transistor, of which a gate is inputted with the third control signal, and a second source/a second drain of the eighteenth thin film transistor is directly coupled to the first node of the nth level GOA circuit unit;

a nineteenth thin film transistor, of which a gate is inputted with the third control signal, and a first source/a first drain of the nineteenth thin film transistor is directly coupled to the first node of the nth level GOA circuit unit, and a second source/a second drain of the nineteenth thin film transistor is directly coupled to a first source/a first drain of a twentieth thin film transistor;

the twentieth thin film transistor, of which a gate is inputted with the third control signal, and a second source/a second drain of the twentieth thin film transistor is directly coupled to the second signal output point of the nth level GOA circuit unit;

wherein for the first level GOA circuit unit, as the forward scan starts, the first node of the n−2th level GOA circuit unit is inputted with a high voltage level signal to be an activation signal;

for the last level GOA circuit unit, as the backward scan starts, the first node of the n+2th level GOA circuit unit is inputted with a high voltage level signal to be an activation signal.

11. The GOA circuit according to claim 10, wherein the first clock signal and the second clock signal are square waves that duty ratios are 0.25, and phases of the first clock signal and the second clock signal are different with a half cycle.

12. The GOA circuit according to claim 10, wherein in a normal display state, the first control signal and the second control signal are alternately to be a high voltage level, and the third control signal is a low voltage level all the time.

13. The GOA circuit according to claim 10, wherein in a low power display state, both the first control signal and the second control signal are low voltage levels, and the third control signal is a high voltage level all the time.

14. The GOA circuit according to claim 13, wherein the low power display state is a standby mode.

15. The GOA circuit according to claim 13, wherein the low power display state is a power saving mode.

* * * * *